US008410825B2

(12) United States Patent
Wasekura

(10) Patent No.: US 8,410,825 B2
(45) Date of Patent: Apr. 2, 2013

(54) DRIVE UNIT FOR DRIVING VOLTAGE-DRIVEN ELEMENT

(75) Inventor: Masaki Wasekura, Toki (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 12/976,481

(22) Filed: Dec. 22, 2010

(65) Prior Publication Data

US 2012/0025897 A1 Feb. 2, 2012

Related U.S. Application Data

(63) Continuation of application No. PCT/JP2010/062911, filed on Jul. 30, 2010.

(51) Int. Cl.
*H03K 3/00* (2006.01)
(52) U.S. Cl. .......................................................... 327/108
(58) Field of Classification Search .................. None
See application file for complete search history.

(56) References Cited

U.S. PATENT DOCUMENTS

| | | | | |
|---|---|---|---|---|
| 5,742,193 | A * | 4/1998 | Colli et al. ..................... | 327/170 |
| 5,910,924 | A | 6/1999 | Tanaka et al. | |
| 6,072,289 | A * | 6/2000 | Li ............................. | 318/400.19 |
| 6,271,709 | B1 * | 8/2001 | Kimura et al. ................ | 327/380 |
| 6,329,872 | B1 * | 12/2001 | Foroudi ........................ | 327/541 |
| 6,333,665 | B1 * | 12/2001 | Ichikawa ...................... | 327/434 |
| 6,411,138 | B2 * | 6/2002 | Yamakita et al. ............. | 327/109 |
| 6,700,419 | B1 * | 3/2004 | Fan et al. ..................... | 327/108 |
| 7,518,406 | B2 * | 4/2009 | Isobe ............................ | 326/83 |
| 2009/0146714 | A1 * | 6/2009 | Nakamori et al. ............ | 327/170 |

FOREIGN PATENT DOCUMENTS

| | | |
|---|---|---|
| JP | A-2000-228868 | 8/2000 |
| JP | A-2000-253646 | 9/2000 |
| JP | A-2001-352748 | 12/2001 |
| JP | A-2004-112916 | 4/2004 |
| JP | A-2006-222593 | 8/2006 |
| JP | A-2006-324963 | 11/2006 |
| JP | A-2009-141690 | 6/2009 |

OTHER PUBLICATIONS

International Search Report for International Patent Application No. PCT/JP2010/062911, mailed on Sep. 7, 2010 (w/ English translation).
Written Opinion for International Patent Application No. PCT/JP2010/062911, mailed on Sep. 7, 2010 (w/ partial English translation).

* cited by examiner

*Primary Examiner* — Lincoln Donovan
*Assistant Examiner* — Khareem E Almo
(74) *Attorney, Agent, or Firm* — Oliff & Berridge, PLC

(57) ABSTRACT

A drive unit comprises a first connector, second connector, switching element, and controller. The first connector is configured to be connected with a gate resistor of a voltage-driven element. The second connector is configured to be connected with a driving power source. A first input-output terminal of the switching element is connected to the first connector, and a second input-output terminal thereof is connected to the second connector. The controller is connected to a control terminal of the switching element, and controls a voltage input to the control terminal of the switching element. The controller has an error amplifier, reference power source, and switch. One input terminal of the error amplifier is connected to the reference power source, an other input terminal thereof is connected to the first connector, and an output terminal thereof is connected to the control terminal of the switching element. One end of the switch is connected to the second connector, and an other end thereof is connected to the control terminal of the switching element.

8 Claims, 8 Drawing Sheets

DRIVE UNIT FOR DRIVING VOLTAGE-DRIVEN ELEMENT

CROSS-REFERENCE TO RELATED APPLICATION

This is a Continuation of International Application No. PCT/JP2010/062911 filed on Jul. 30, 2010, the disclosure of which is hereby incorporated by reference herein in its entirety.

TECHNICAL FIELD

The present techings relates to a drive unit for driving a voltage-driven element.

DESCRIPTION OF RELATED ART

A voltage-driven element is an element capable of performing a specific function using driving voltage, and is widely used in various applications. In an example of a voltage-driven element, a voltage-driven switching element comprising an insulated gate is known. The voltage-driven switching element controls current value based on gate voltage (an example of the driving voltage) supplied to the insulated gate, and is used, e.g., in an inverter system that converts direct current voltage to alternating current voltage. A power semiconductor switching element that includes an IGBT (Insulated Gate Bipolar Transistor) and a MOSFET (Metal Oxide Semiconductor Field Effect Transistor) can be given as an example of a voltage-driven switching element.

In order to supply driving voltage to this type of voltage-driven element, a drive unit is connected to the voltage-driven element. The drive unit is configured to control the driving voltage supplied to the voltage-driven element. The drive unit can control the driving voltage based on a control signal that commands on-off of the voltage-driven element. The drive unit can further control the driving voltage based on a signal representing a driving state of the voltage-driven element, or a signal representing a state of the external environment.

In this type of drive unit, development of a technique to generate high precision driving voltage is desired. If the precision of the driving voltage generated by the drive unit is low, the driving conditions of the voltage-driven element must be set taking the precision of the driving voltage into consideration. Consequently, if the precision of the driving voltage is low, the voltage-driven element cannot be driven under optimal conditions. Consequently, problems such as an increase in the surge voltage of the voltage-driven element, or an increase in power loss of the voltage-driven element occur.

An example of a drive unit capable of generating a high precision driving voltage is taught in Japanese Patent Publication No. 2006-324963. This drive unit comprises a first connector, a second connector, a switching element, and a controller. The first connector is configured to be connected to a gate resistor of the voltage-driven element. The second connector is configured to be connected to a driving power source. An output terminal of the switching element is connected to the first connector, and an input terminal thereof is connected to the second connector. The controller is connected to a control terminal of the switching element, and controls voltage input to the switching element.

The controller of this drive unit is characterized in performing feedback control of output voltage of the switching element. Specifically, the controller of the drive unit is configured to compare the output voltage of the switching element with a high precision reference voltage, and to control the voltage input to the control terminal of the switching element based on the results of this comparison. The output voltage of the switching element is thus maintained at a desired value, and high precision driving voltage is supplied to the first connector. Since high precision driving voltage is supplied to the gate resistor of the voltage-driven element, the voltage-driven element can be controlled with high precision. Since this drive unit can generate high precision driving voltage, it can provide results useful for many purposes.

BRIEF SUMMARY OF INVENTION

Contrary to the above, even a higher precision driving voltage may be required. In the drive unit of Japanese Patent Publication No. 2006-324963, a switching transistor for switching the controller on/off is positioned between the first connector and the output terminal of the switching element. Consequently, in this drive unit, the driving voltage supplied to the first connector has a magnitude that is the output voltage of the switching element minus the voltage drop caused by the switching transistor.

Typically, the on-resistance of a transistor is known to vary widely for each element. Consequently, in this drive unit, even if the output voltage of the switching element is controlled with high precision by means of feedback control, the variation in the voltage drop of the switching transistor, which depends on the variation in the on-resistance of the switching transistor, means that variation also occurs in the driving voltage supplied to the first connector.

The technique taught in the present specification aims to teach a drive unit which generates high precision driving voltage.

In the drive unit taught in the present specification, a switch for switching a controller on/off is characteristically being positioned between a second connector and a control terminal of a switching element. Consequently, the drive unit taught in the present specification is configured to be able to perform feedback control directly on the voltage of the first connector. Since feedback control is performed on the driving voltage supplied to the gate resistor of the voltage-driven element, the driving voltage supplied to the gate resistor of the voltage-driven element is controlled with high precision.

BRIEF DESCRIPTION OF DRAWINGS

FIG. 6(A) shows a timing chart of the first driving signal. FIG. 6(B) shows a timing chart of the current adjustment signal. FIG. 6(C) shows a timing chart of the voltage of the first connector and the gate voltage of the voltage-driven element.

FIG. 8(A) shows a timing chart of the first driving signal. FIG. 8(B) shows a timing chart of the partial voltage adjustment signal. FIG. 8(C) shows the voltage of the first connector and the gate voltage of the voltage-driven element.

DETAILED DESCRIPTION OF INVENTION

Figure 1:
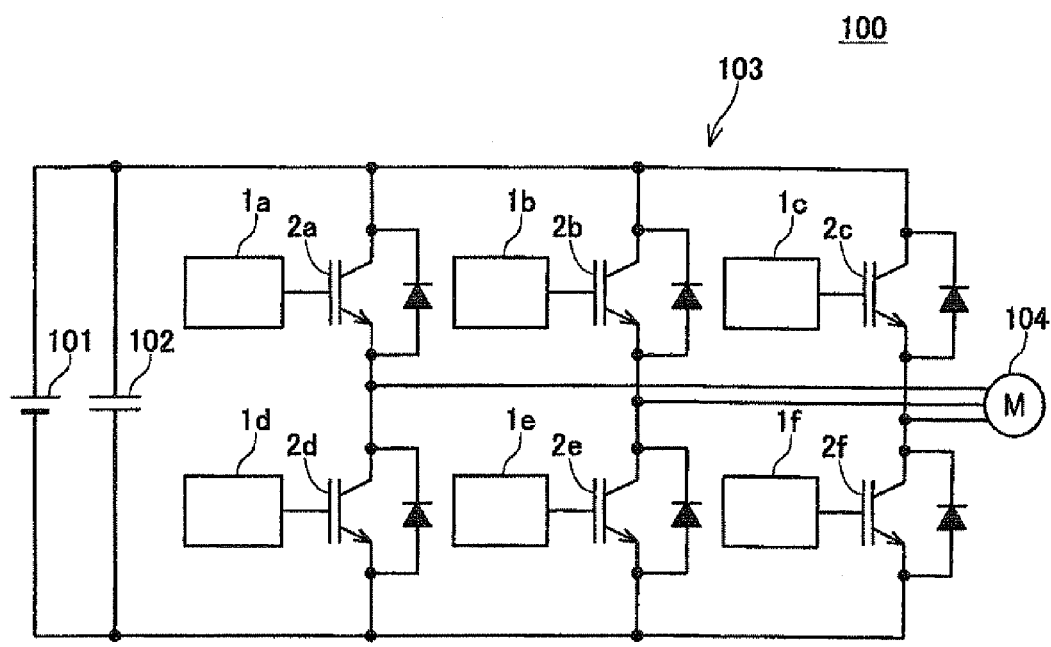
FIG. 1 shows the basic configuration of an inverter system.

A drive unit taught in the present specification is used for driving a voltage-driven element. Here, the voltage-driven element is an element capable of performing a specific function using driving voltage. The voltage-driven element may be a voltage-driven switching element having an insulated gate, and in particular may be a power semiconductor switching element. An IGBT, MOSFET, and thyristor may be included in the power semiconductor switching element. The drive unit comprises a first connector, second connector, switching element, and controller. The first connector is configured to be connected with a gate resistor of the voltage-driven element. The second connector is configured to be connected with a driving power source. An example of the driving power source may include a transformer type power source. A first input-output terminal of the switching element is connected to the first connector, and a second input-output terminal of the switching element is connected to the second connector. An example of the switching element may include a voltage-driven switching element having an insulated gate. It is desirable for an element with a rapid switching speed to be used in the switching element. Consequently, it is desirable for a MOSFET to be used in the switching element. The controller is connected to a control terminal of the switching element, and controls voltage input to the control terminal of the switching element. The controller has an error amplifier, a reference power source, and a switch. One input terminal of the error amplifier is connected to the reference power source, an other input terminal of the error amplifier is connected to the first connector, and an output terminal of the error amplifier is connected to the control terminal of the switching element. It is desirable for the error amplifier to be configured so as to amplify and output error between the two input terminals. An example of the error amplifier may include an operational amplifier. Further, another example of the error amplifier may include a circuit consisting of an A/D converter, a digital signal processing circuit, and a D/A converter. One end of the switch is connected to the second connector, and the other end of the switch is connected to the control terminal of the switching element. When the switch is closed, the second input-output terminal of the switching element and the control terminal are short-circuited, thus turning off the switching element. Consequently, when the switch has been closed, the supply of driving voltage to the voltage-driven element halts. When the switch is opened, the switching element turns on, and the driving voltage is supplied to the voltage-driven element. In this drive unit, the switch for switching the controller on/off is positioned between the second connector and the control terminal of the switching element. Consequently, this drive unit is configured such that feedback control of the voltage of the first connector can be performed directly. Since the driving voltage supplied to the gate resistor of the voltage-driven element undergoes feedback control, the driving voltage supplied to the gate resistor of the voltage-driven element is controlled with high precision.

In the drive unit taught in the present specification, the switch may be opened in synchrony with turning on of the voltage-driven element. Here, "in synchrony" typically includes the case of the time coinciding exactly within a range of control precision required by the voltage-driven element or drive unit. Further, "in synchrony" also includes the case of operation based on a common signal. "In synchrony" may include, e.g., the case where a signal commanding that the switch be opened/closed and a signal commanding that the voltage-driven element be turned on are in common and, as long as the signals are in common, the term may even include the case where the time of opening/closing the switch and the time of turning on the voltage-driven element do not coincide. The surge voltage and switching loss of the voltage-driven element strongly affect the switching speed of the voltage-driven element. Consequently, in order to improve the surge voltage and switching loss of the voltage-driven element, it is important to supply high precision driving voltage at the time of turning on the voltage-driven element. By opening on the switch in synchrony with the turning on of the voltage-driven element, the drive unit can supply high precision driving voltage in synchrony with turning on of the voltage-driven element. Consequently, the surge voltage and switching loss of the voltage-driven element can be improved.

The current capacity of the voltage-driven element is large in the case where the voltage-driven element handles a large amount of power, e.g. such as in the case where the voltage-driven element is mounted in an inverter system for a vehicle. The current capacity of the switching element of the drive unit must also be increased in order to drive the voltage-driven element having a large current capacity for a short time. When the current capacity of the switching element increases, the slew rate of the error amplifier must also be increased. However, when the slew rate of the error amplifier is increased, steady-state loss of the error amplifier increases.

One aspect of a drive unit to solve the aforementioned problem may further comprise a current amplifier circuit amplifying an output current output from the first input-output terminal of the switching element and supplying this amplified output current to the first connector. By providing the current amplifier circuit, the voltage-driven element having a large current capacity can be driven for a short time without increasing the current capacity of the switching element. Consequently, since the slew rate of the error amplifier of the controller need not be increased, an increase in the steady-state loss of the error amplifier can also be avoided.

An other aspect of a drive unit to solve the aforementioned problem, in the case where the error amplifier is an operational amplifier, may further comprise a tail current adjusting circuit configured to adjust a tail current value of the operational amplifier. As described above, the operational amplifier often requires a large slew rate at the time of turning on the voltage-driven element. Consequently, by increasing the tail current value of the operational amplifier using the tail current adjusting circuit when the voltage-driven element is turned on, the tail current value of the operational amplifier is increased at the required time, while an increase in the steady-state loss of the operational amplifier is suppressed, and the voltage-driven element having a large current capacity can be driven for a short time. More preferably, it is desirable that, when the voltage-driven element is turned on, the tail current adjusting circuit: (1) increases the tail current value before the voltage of the first connector reaches a steady state, and (2) reduces the tail current value before the voltage of the first connector reduces from the steady state.

In order to improve the trade-off between surge voltage and switching loss of the voltage-driven element, one may want to switch the switching speed of the voltage-driven element over time. For instance, an increase in switching loss is suppressed by accelerating the switching speed of the voltage-driven element in the period when switching loss becomes a greater problem than surge voltage, and surge voltage is suppressed by decelerating the switching speed of the voltage-driven element in the period when surge voltage becomes a greater problem than switching loss. Thus, the trade-off between surge voltage and switching loss of the voltage-driven element can be improved by switching the switching speed of the voltage-driven element over time. To meet this type of demand, the controller may be configured to be capable of controlling the voltage that is input to the control terminal of the switching element in order to switch the voltage of the first connector to a fixed voltage having a different size. According to this aspect, the driving voltage supplied to the gate resistor of the voltage-driven element is switched. When the driving voltage is large, the switching speed of the voltage-driven element is accelerated, and when the driving voltage is small, the switching speed of the voltage-driven element is decelerated. According to this aspect, the trade-off between surge voltage and switching loss of the voltage-driven element can be improved.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide an improved drive unit for driving a voltage-driven element.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

Below, embodiments will be described with reference to the figures. Moreover, common components in the embodiments will have common reference numbers appended thereto, and an explanation thereof will be omitted.

First Embodiment

FIG. 1 shows a basic configuration of an inverter system 100 mounted in a vehicle. The inverter system 100 comprises a DC power supply 101, a smoothing capacitor 102, and an inverter unit 103. The inverter unit 103 comprises six voltage-driven elements 2a~2f, and six drive units 1a~1f that drive the voltage-driven elements 2a~2f. An IGBT is used in the voltage-driven elements 2a~2f. The six voltage-driven elements 2a~2f constitute a three-phase bridge connection. Diodes used for circulating current are connected antiparallel to each of the voltage-driven elements 2a~2f. By switching direct current voltage supplied from the DC power supply 101 via the smoothing capacitor 102, the inverter unit 103 changes the direct current voltage to alternating current voltage and supplies this to an alternating current motor 104. Since each of the six drive units 1a~1f has an equivalent circuit configuration, the six drive units 1a~1f will be described below without making a particular distinction between them.

Figure 2:
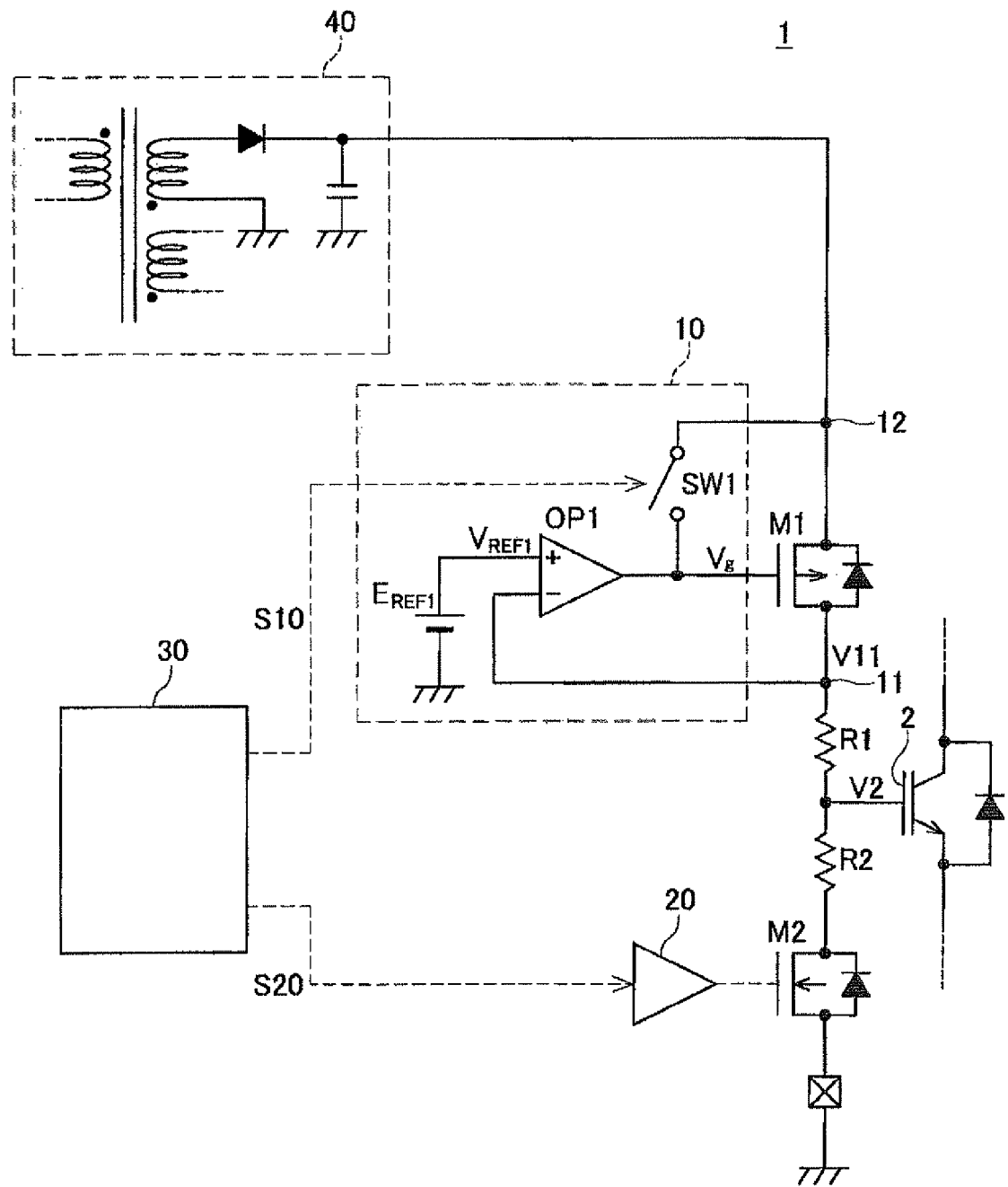
FIG. 2 shows the basic configuration of a drive unit of a first embodiment.

FIG. 2 shows the basic configuration of a drive unit 1 that drives a voltage-driven element 2. The drive unit 1 comprises a pair of gate resistors R1, R2 connected to an insulated gate of the voltage-driven element 2, a pair of transistors M1, M2, a first controller 10 that controls the first transistor M1, a second controller 20 that controls the second transistor M2, a control block 30 that controls the first controller 10 and the second controller 20, and a transformer type driving power source 40.

The first gate resistor R1 is a fixed resistive element. One end of the fixed resistive element is connected to the insulated gate of the voltage-driven element 2, and the other end of this fixed resistive element is connected to a first connector 11. The first gate resistor R1 determines the charging speed of the gate current of the voltage-driven element 2. The second gate resistor R2 is a fixed resistive element. One end of the fixed resistive element is connected to the insulated gate of the voltage-driven element 2, and the other end of the fixed resistive element is connected to the second transistor M2. The second gate resistor R2 determines the discharging speed of the gate current of the voltage-driven element 2.

The first transistor M1 is a p type MOSFET, and is provided between the voltage-driven element 2 and the driving power source 40. More specifically, a drain terminal of the first transistor M1 is connected to the first gate resistor R1 via the first connector 11, and a source terminal of the first transistor M1 is connected to high potential side wiring of the driving power source 40 via a second connector 12. When the voltage-driven element 2 is turned on, the first transistor M1 is turned on, thereby supplying a positive driving voltage to the insulated gate of the voltage-driven element 2 from the driving power source 40 via the first transistor M1.

The second transistor M2 is an n type MOSFET, and is provided between the voltage-driven element 2 and a ground terminal. When the voltage-driven element 2 is turned off, the second transistor M2 is turned on, thereby supplying a ground voltage to the insulated gate of the voltage-driven element 2 via the second transistor M2.

Based on a control signal supplied from an electronic control unit (ECU) (not shown), the control block 30 outputs a first driving signal S10 to the first controller 10, and outputs a second driving signal S20 to the second controller 20.

The first controller 10 has an operational amplifier OP1, a reference power source $E_{REF1}$, and a switch SW1. A non-inverting input terminal of the operational amplifier OP1 is connected to the reference power source $E_{REF1}$, an inverting input terminal of the operational amplifier OP1 is connected to the first connector 11, and an output terminal of the operational amplifier OP1 is connected to a control terminal of the first transistor M1. One end of the switch SW1 is connected to the second connector 12, and the other end of the switch SW1 is connected to the control terminal of the first transistor M1.

Next, the operation of the drive unit 1 will be described. In the first controller 10, when the switch SW1 is opened based on the first driving signal S10 output from the control block 30, the first transistor M1 turns on. At this time, in the second controller 20, the second transistor M2 turns off based on the second driving signal S20 output from the control block 30. When the first transistor M1 turns on, a positive driving voltage is supplied to the first connector 11 from the driving power source 40 via the first transistor M1. A voltage V11 of the first connector 11 is input to the inverting input terminal of the operational amplifier OP1, and the reference voltage $V_{REF1}$ of the reference power source $E_{REF1}$ is input to the non-inverting input terminal. Consequently, the first controller 10 compares the voltage V11 of the first connector 11 with the reference voltage $V_{REF1}$ and, based on the results of this comparison, controls a gate voltage Vg input to the first transistor M1. Consequently, the voltage V11 of the first connector 11 is maintained such that it conforms to the reference voltage $V_{REF1}$ of the reference power source $E_{REF1}$. Since the voltage V11 of the first connector 11 is being controlled with high precision, the charging speed of a gate current determined by the first gate resistor R1 connected directly with the first connector 11 is also controlled with high precision.

Since the power source precision of the transformer type driving power source 40 is low, the output voltage of the driving power source 40 is known to fluctuate within the range of a number V. Consequently, in the case where the technique of the present embodiment is not used, when the output voltage of the driving power source 40 fluctuates lower, the charging speed of the gate current decelerates below a set value, the time required to turn on the voltage-driven element 2 becomes longer, and switching loss increases. On the other hand, when the output voltage of the driving power source 40 fluctuates higher, the charging speed of the gate current accelerates above the set value, the rate-of-change of current for turning on the voltage-driven element 2 increases, and the surge voltage occurs.

In the drive unit 1 of the present embodiment, by performing feedback control of the voltage V11 of the first connector 11 using the high precision reference power source $E_{REF1}$, the output voltage of the driving power source 40 is not affected by fluctuation, and the voltage V11 of the first connector 11 can be controlled with extremely high precision. Further, the first connector 11 and the first gate resistor R1 are connected directly in the drive unit 1 of the present embodiment, and consequently driving voltage controlled with high precision is supplied constantly to an end of the first gate resistor R1. Consequently, the drive unit 1 of the present embodiment can control, with high precision, the charging speed of the gate current determined by the first gate resistor R1, and since the voltage-driven element 2 can be driven with high precision, the occurrence of unintended surge voltage or an increase in switching loss can be suppressed.

Second Embodiment

Figure 3:
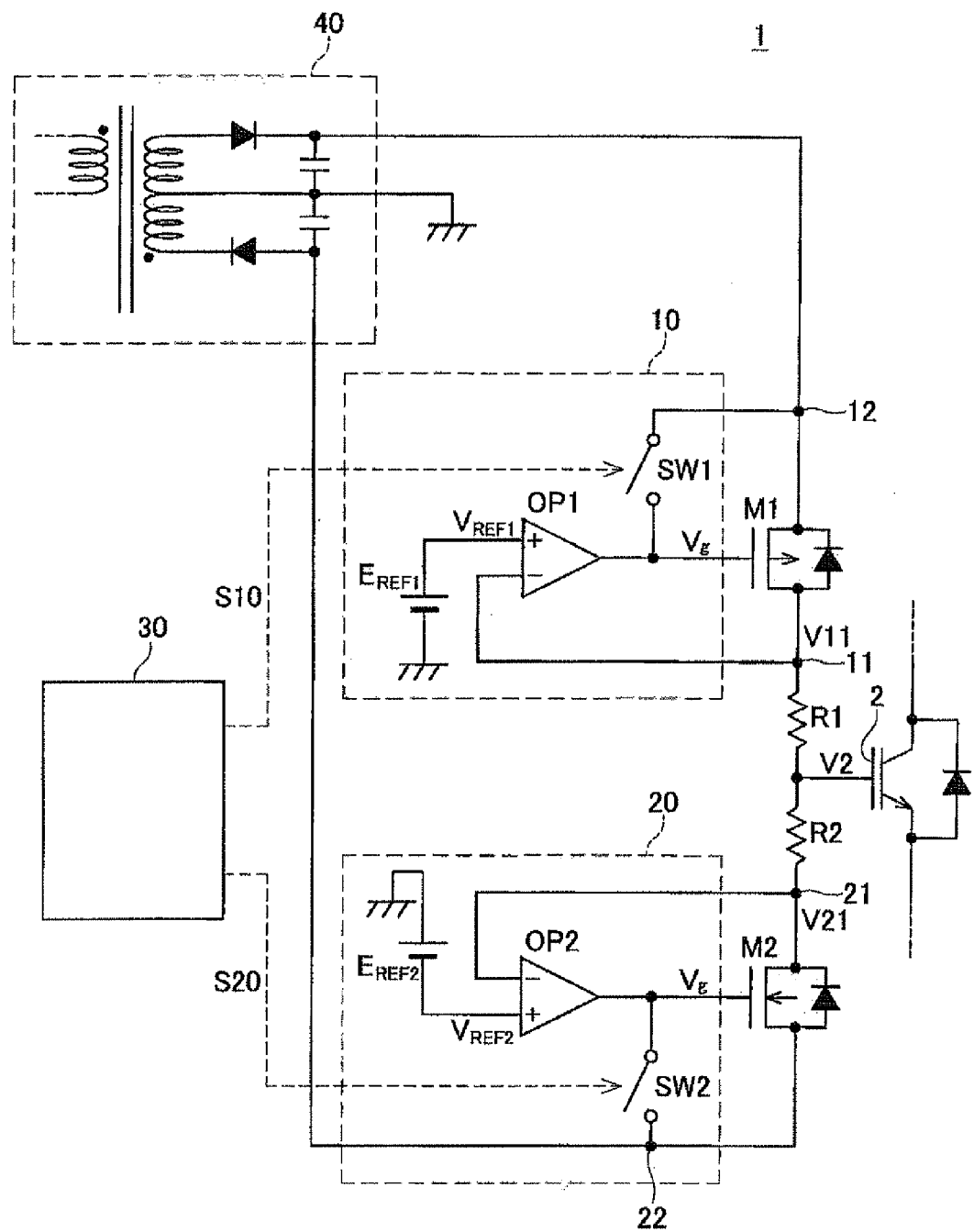
FIG. 3 shows the basic configuration of a drive unit of a second embodiment.

FIG. 3 shows a basic configuration of a drive unit 1 of a second embodiment. This drive unit 1 is characteristically being provided with a circuit that controls voltage, with high precision, to a second controller 20 as well. In this case, a drain terminal of a second transistor M2 is connected to a second gate resistor R2 via a third connector 21, and a source terminal of the second transistor M2 is connected to a negative potential side wiring of a driving power source 40 via a fourth connector 22. The second controller 20 has a second operational amplifier OP2, a second reference power source $E_{REF2}$, and a second switch SW2. A non-inverting input terminal of the second operational amplifier OP2 is connected to the second reference power source $E_{REF2}$, an inverting input terminal of the second operational amplifier OP2 is connected to the third connector 21, and an output terminal of the second operational amplifier OP2 is connected to a control terminal of the second transistor M2. One end of the second switch SW2 is connected to the fourth connector 22, and the other end of the second switch SW2 is connected to the control terminal of the second transistor M2.

In the second controller 20, when the switch SW2 opens based on a second driving signal S20 output from a control block 30, the second transistor M2 turns on. At this time, in the first controller 10, the first transistor M1 turns off based on a first driving signal S10 output from the control block 30. When the second transistor M2 turns on, a negative driving voltage is supplied to the third connector 21 from the driving power source 40 via the second transistor M2. A voltage V21 of the third connector 21 is input to the inverting input terminal of the second operational amplifier OP2, and the reference voltage $V_{REF2}$ of the second reference power source $E_{REF2}$ is input to the non-inverting input terminal. Consequently, the second controller 20 compares the voltage V21 of the third connector 21 with the reference voltage $V_{REF2}$ and, based on the results of comparison, controls a gate voltage Vg input to the second transistor M2. Consequently, the voltage V21 of the third connector 21 is maintained such that it conforms to the reference voltage $V_{REF2}$ of the second reference power source $E_{REF2}$. Since the voltage V21 of the third connector 21 is being controlled with high precision, the discharging speed of a gate current determined by the second gate resistor R2 connected directly with the third connector 21 is also controlled with high precision.

Third Embodiment

Figure 4:
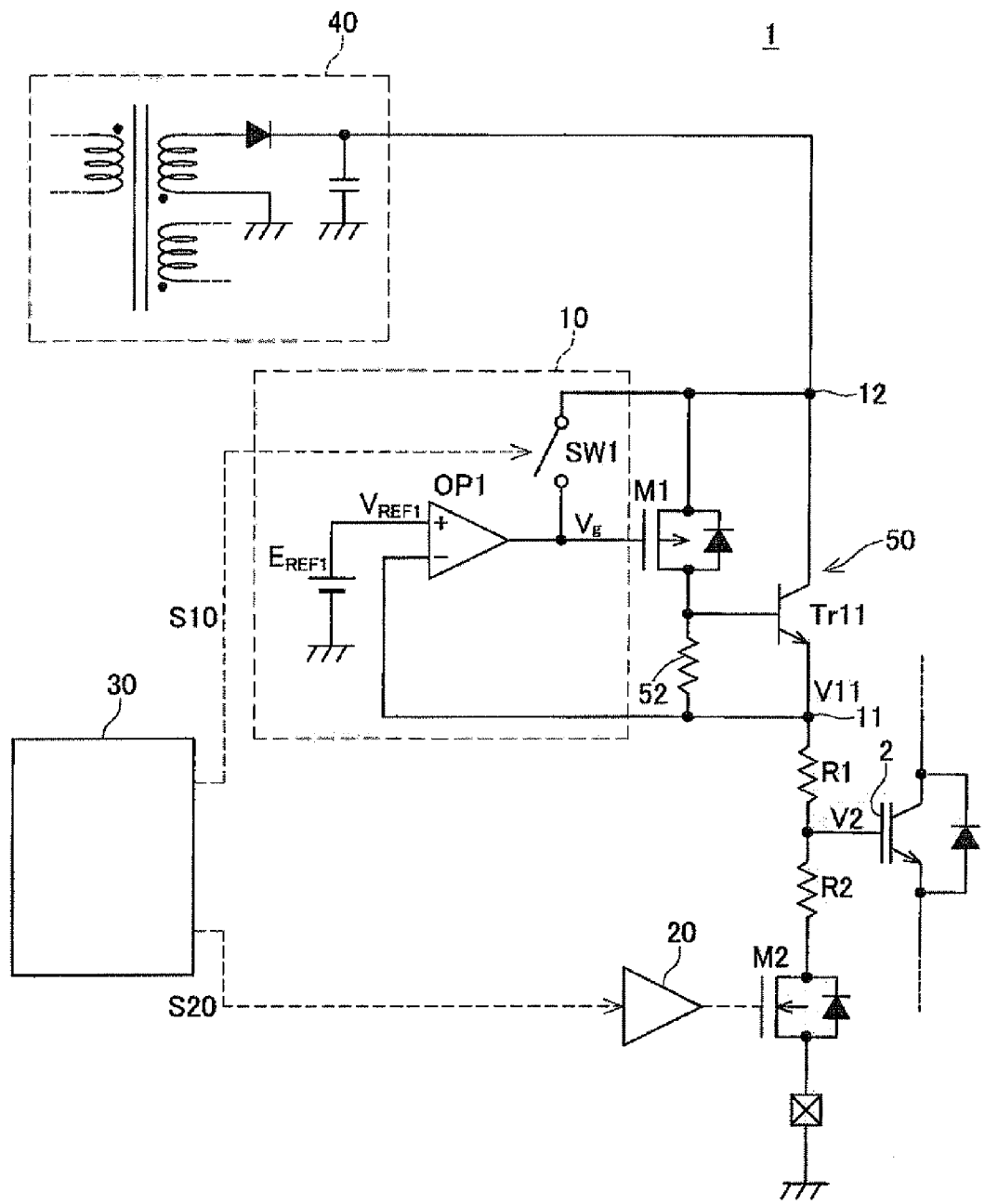
FIG. 4 shows the basic configuration of a drive unit of a third embodiment.

FIG. 4 shows a basic configuration of a drive unit 1 of a third embodiment. This drive unit 1 is characteristically comprising a current amplifier circuit 50 that amplifies an output current output from a drain terminal of a first transistor M1, and supplies this amplified output current to a first connector 11.

The current amplifier circuit 50 comprises a bipolar transistor Tr11 and a resistor 52. The bipolar transistor Tr11 is an npn type. An emitter terminal of the bipolar transistor Tr11 is connected to the first connector 11, a collector terminal of the bipolar transistor Tr11 is connected to the second connector 12, and a base terminal of the bipolar transistor Tr11 is connected to the drain terminal of the first transistor M1. One end of the resistor 52 is connected to the first connector 11, and the other end of the resistor 52 is connected to the drain terminal of the first transistor M1 and the base terminal of the bipolar transistor Tr11. The current amplifier circuit 50 constitutes an emitter follower circuit. Moreover, instead of the bipolar transistor Tr11, a transistor having an insulated gate may be used in the current amplifier circuit 50.

Since the voltage-driven element 2 mounted in the inverter system 100 for a vehicle (see FIG. 1) may need to handle a large current, its current capacity is large. Consequently, in order to suppress an increase in switching loss, the voltage-driven element 2 having a large current capacity must be turned on for a short time, and consequently requires a large gate charging current. For instance, in a drive unit 1, as in the first embodiment, that is not provided with the current amplifier circuit 50, the current capacity of the first transistor M1 must be increased to obtain a large gate charging current. If the current capacity of the first transistor M1 is increased, the slew rate of the operational amplifier OP1 of the first controller 10 must also be increased. However, if the slew rate of the operational amplifier OP1 of the first controller 10 is increased, the tail current of the operational amplifier OP1 also increases, and the steady-state loss of the operational amplifier OP1 increases.

The drive unit 1 having the current amplifier circuit 50, as in the present embodiment, can amplify the output current which is output from the drain terminal of the first transistor M1, and supply this to the first connector 11. By providing the current amplifier circuit 50, a large gate charging current can be obtained without increasing the current capacity of the first transistor M1. Consequently, since it is not necessary to increase the slew rate of the operational amplifier OP1 of the first controller 10, the tail current of the operational amplifier OP1 can be kept low, and an increase in the steady-state loss of the operational amplifier OP1 can be suppressed.

Further, in the case where the inverter system 100 is created, which controls a plurality of alternating current motors 104 having differing outputs, it is desirable to have the current capacity of the voltage-driven element 2 differ for each of the alternating current motors 104. In this case, it is desirable that the voltage-driven element 2 having a large current capacity is used in the alternating current motor 104 having a large output, and the voltage-driven element 2 having a small current capacity is used in the alternating current motor 104 having a small output. In this manner, when the respective current capacities of the voltage-driven elements 2 differ, it is desirable to provide drive units 1 whose current capacities also differ to correspond to the size of the current capacity of the voltage-driven elements 2. In this type of case, the drive unit 1 of the present embodiment is useful. That is, the first transistor M1 and the controller 10 can be made in common by providing the drive units 1 in which the current amplifier circuit 50 is connected to the drive unit 1 that drives the voltage-driven element 2 having a large current capacity, and the current amplifier circuit 50 is not connected to the drive unit 1 that drives the voltage-driven element 2 having a small current capacity. If this type of configuration is adopted, the first transistor M1 and the controller 10 can be made monolithic, and can contribute to reducing the cost of the drive units 1.

Fourth Embodiment

Figure 5:
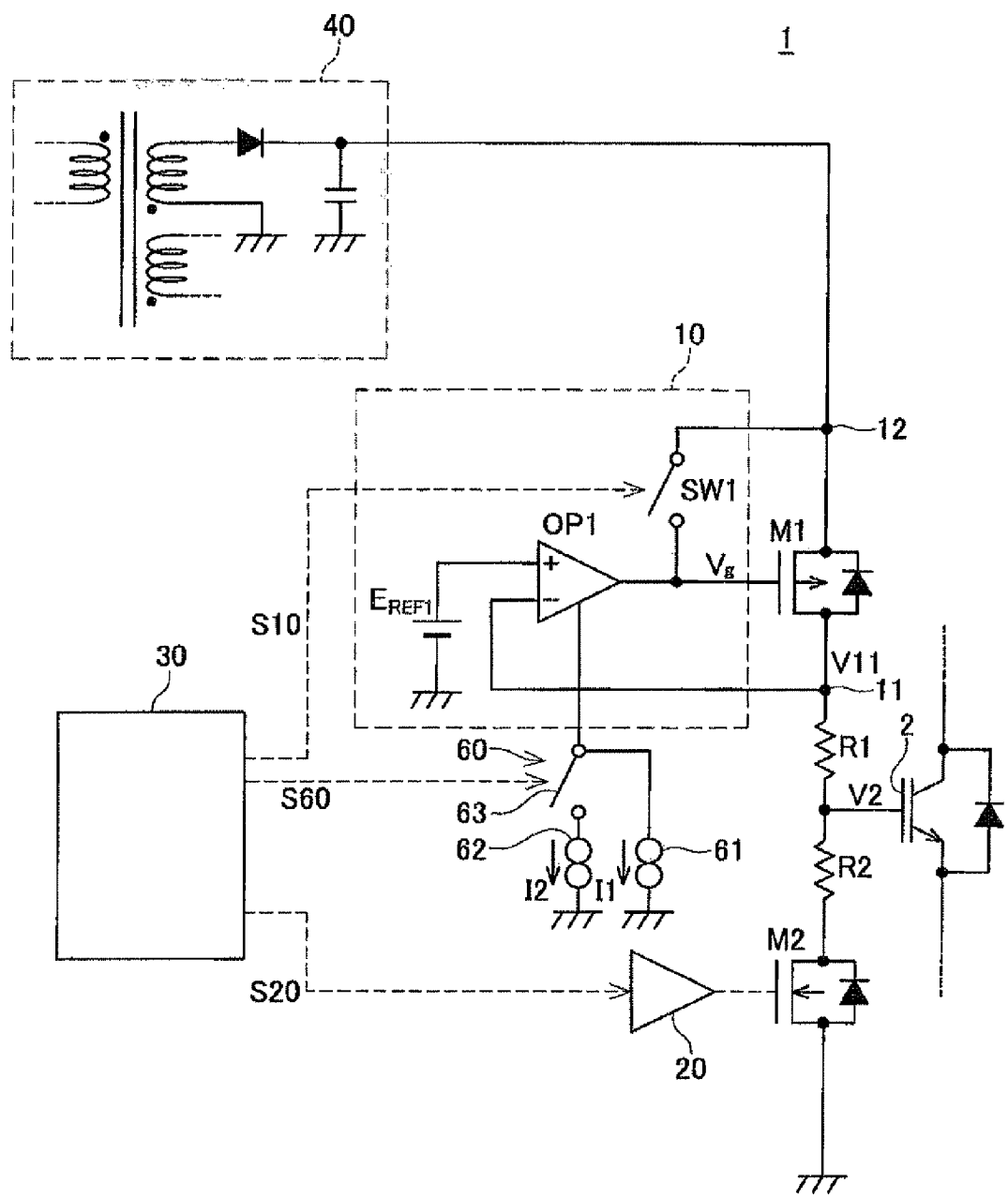
FIG. 5 shows the basic configuration of a drive unit of a fourth embodiment.

FIG. 5 shows a basic configuration of a drive unit 1 of a fourth embodiment. This drive unit 1 is characterized in comprising a tail current adjusting circuit 60 that adjusts a tail current value of an operational amplifier OP1 of a first controller 10. The tail current adjusting circuit 60 has a first constant current source 61, a second constant current source 62, and a switch 63. One end of the first constant current source 61 is connected to the operational amplifier OP1, and the other end of the first constant current source 61 is grounded. The first constant current source 61 generates a first constant current I1. One end of the second constant current source 62 is connected to the switch 63, and the other end of the second constant current source 62 is grounded. The second constant current source 62 generates a second constant current I2. The first constant current I1 and the second constant current I2 may have an identical size or differing sizes. One end of the switch 63 is connected to the operational amplifier OP1, and the other end of the switch 63 is connected to the second constant current source 62. The switch 63 is configured to be capable of switching on/off based on a current adjustment signal S60 output from the control block 30. In accordance with the switching of the switch 63 between on and off, the tail current value supplied to the operational amplifier OP1 is switched between the first constant current I1 generated by the first constant current source 61, and a total current (I1+I2) of the first constant current I1 generated by the first constant current source 61 and the second constant current I2 generated by the second constant current source 62.

Figure 6:
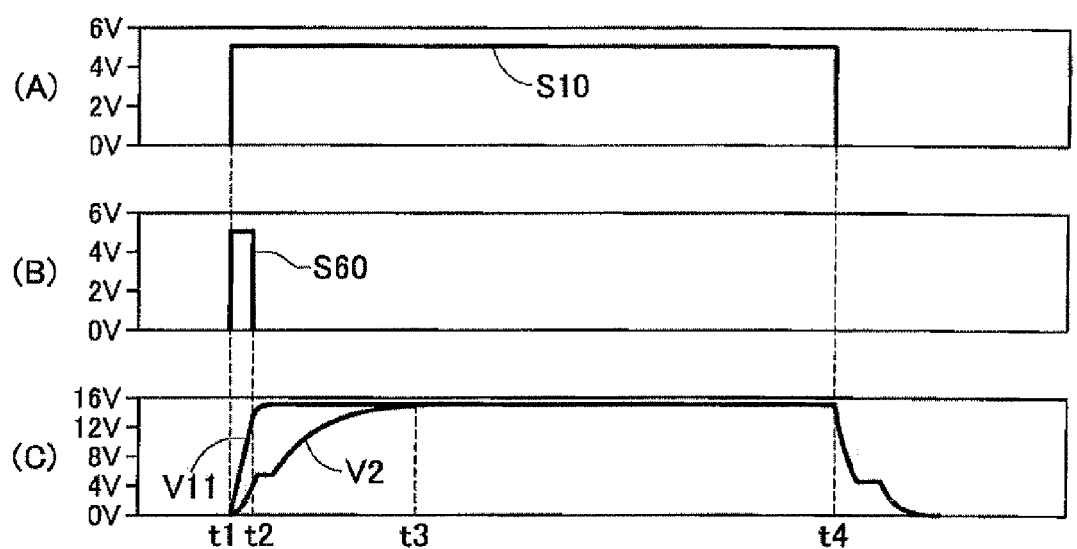
FIG. 6 shows a timing chart of the drive unit of the third embodiment.

FIG. 6 shows a timing chart of the drive unit 1 of the third embodiment. FIG. 6 (A) shows a first driving signal S10 input to a first controller 10, FIG. 6 (B) shows a current adjustment signal S60 input to the tail current adjusting circuit 60, FIG. 6(C) shows a voltage V11 of the first connector 11 and a gate voltage V2 of the insulated gate of a voltage-driven element 2.

As shown in FIG. 6(A), the first driving signal S10 of the first controller 10 rises at a time t1 and falls at a time t4. As described above, a first transistor M1 turns on in synchrony with the rise of the first driving signal S10, and turns off in synchrony with the fall of the first driving signal S10. Consequently, as shown in FIG. 6(C), the voltage V11 of the first connector 11 and the gate voltage V2 of the voltage-driven element 2 both increase at the time t1 and decrease at the time t4.

As shown in FIG. 6(B), the current adjustment signal S60 rises at the time t1, and falls at a time t2. The tail current adjusting circuit 60 thus supplies the total current (I1+I2) of the first constant current source 61 and the second constant current source 62 to the operational amplifier OP1 only in the period when the voltage-driven element 2 is turned on. The tail current adjusting circuit 60 supplies the first constant current I1 of the first constant current source 61 to the operational amplifier OP1 in a period other than the period when the voltage-driven element 2 is turned on.

As described above, the operational amplifier OP1 of the first controller 10 often requires a large slew rate in the period when the voltage-driven element 2 is turned on. The operational amplifier OP1 of the first controller 10 does not require a large slew rate in the period other than the period when the voltage-driven element 2 is turned on. Consequently, by increasing the tail current value of the operational amplifier OP1 using the tail current adjusting circuit 60 only in the period when the voltage-driven element 2 is turned on, the tail current value of the operational amplifier OP1 can be increased and the voltage-driven element 2 having a large current capacity can be driven for a short time when required, while an increase in the steady-state loss of the operational amplifier OP1 is suppressed.

Moreover, in the above example, the current adjustment signal S60 rises at the time t1, and falls at the time t2. This is merely an example, and the current adjustment signal S60 may rise at another time and fall at another time. It is desirable for the rise of the current adjustment signal S60 to be set in a range before the time when the voltage V11 of the first connector 11 reaches a steady state. More preferably, it is desirable for the rise of the current adjustment signal S60 to be set in a range before the first driving signal S10 input to the first controller 10 rises. Further, it is desirable for the fall of the current adjustment signal S60 to be set in a range before the first driving signal S10 input to the first controller 10 falls (see t4). More preferably, it is desirable for the fall of the current adjustment signal S60 to be set in a range before the gate voltage V2 of the voltage-driven element 2 reaches a steady state (see t3).

Fifth Embodiment

Figure 7:
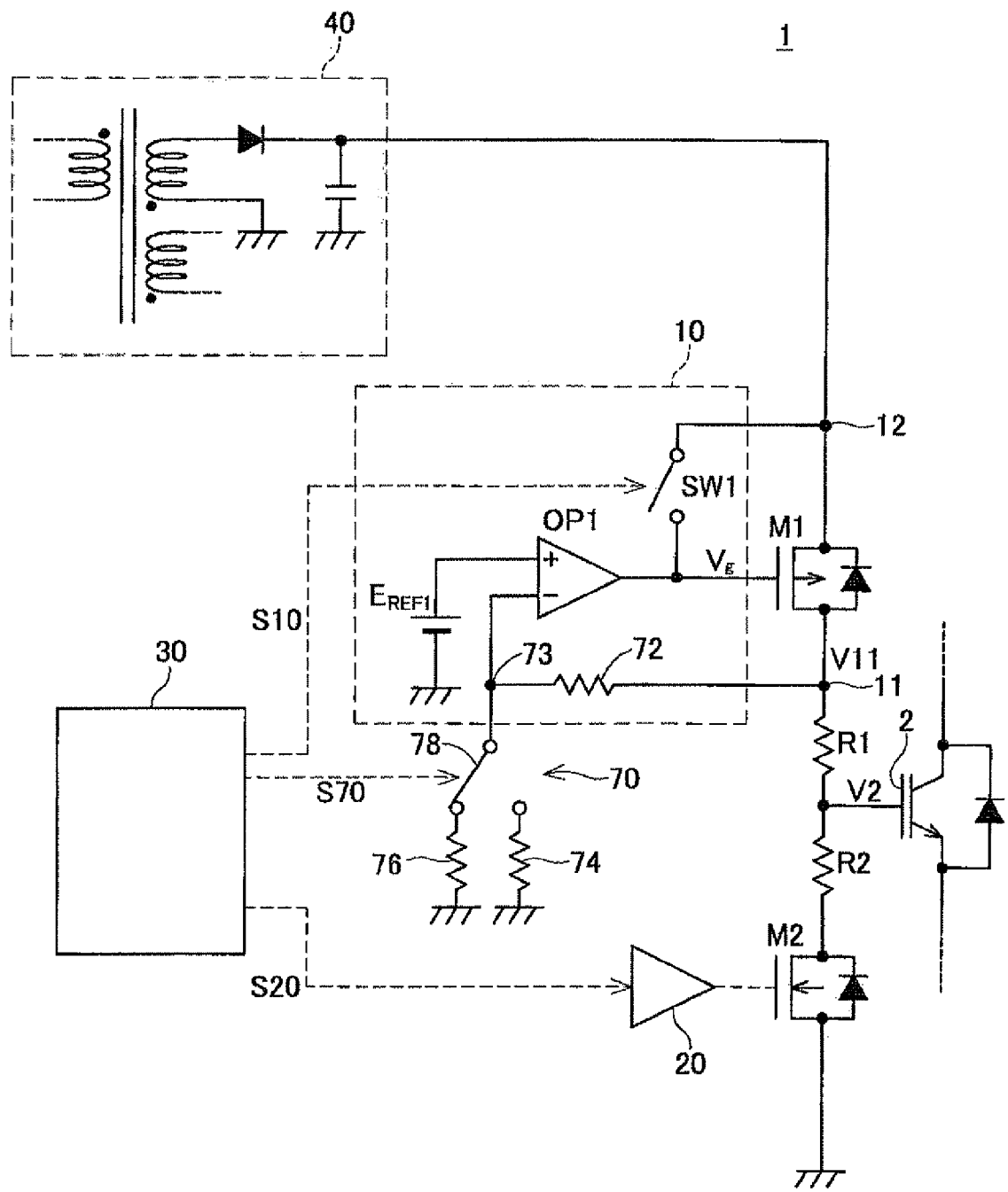
FIG. 7 shows the basic configuration of a drive unit of a fifth embodiment.

FIG. 7 shows a basic configuration of a drive unit 1 of a fifth embodiment. This drive unit 1 is characterized in comprising a partial voltage adjusting circuit 70 for switching a voltage V11 of a first connector 11. The partial voltage adjusting circuit 70 comprises first-third resistors 72, 74, 76 for adjusting a partial voltage, and a switch 78. The first resistor 72 for adjusting the partial voltage is a fixed resistive element. One end of the first resistor 72 is connected to the first connector 11, and the other end of the first resistor 72 is connected to an intermediate connection point 73. The second resistor 74 for adjusting partial voltage is a fixed resistive element. One end of the second resistor 74 is configured such that this end can be connected to the intermediate connection point 73 via the switch 78, and the other end of the second resistor 74 is grounded. The third resistor 76 for adjusting partial voltage is a fixed resistive element. One end of the third resistor 76 is configured such that this end can be connected to the intermediate connection point 73 via the switch 78, and the other end of the third resistor 76 is grounded. The intermediate connection point 73 is connected to the inverting input terminal of the operational amplifier OP1.

A resistance value of the second resistor 74 for adjusting partial voltage and a resistance value of the third resistor 76 for adjusting partial voltage differ. Consequently, when the switch 78 switches the connection between the second resistor 74 for adjusting partial voltage and the third resistor 76 for adjusting partial voltage, the partial voltage value of the intermediate connection point 73 changes. Consequently, the voltage V11 of the first connector 11 also switches.

Figure 8:
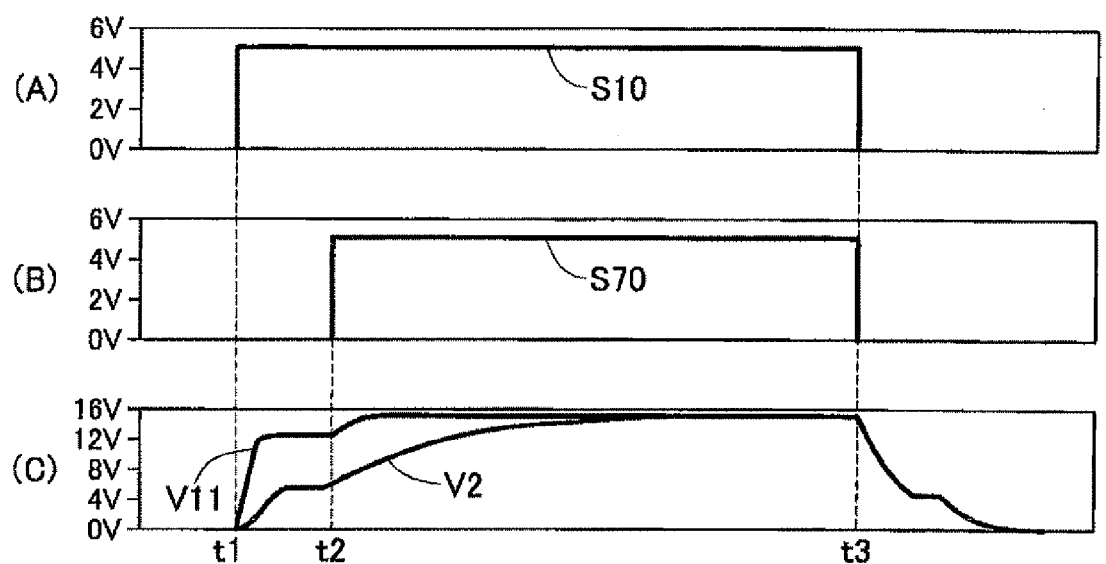
FIG. 8 shows a timing chart of the drive unit of the fifth embodiment.
Figure 2:
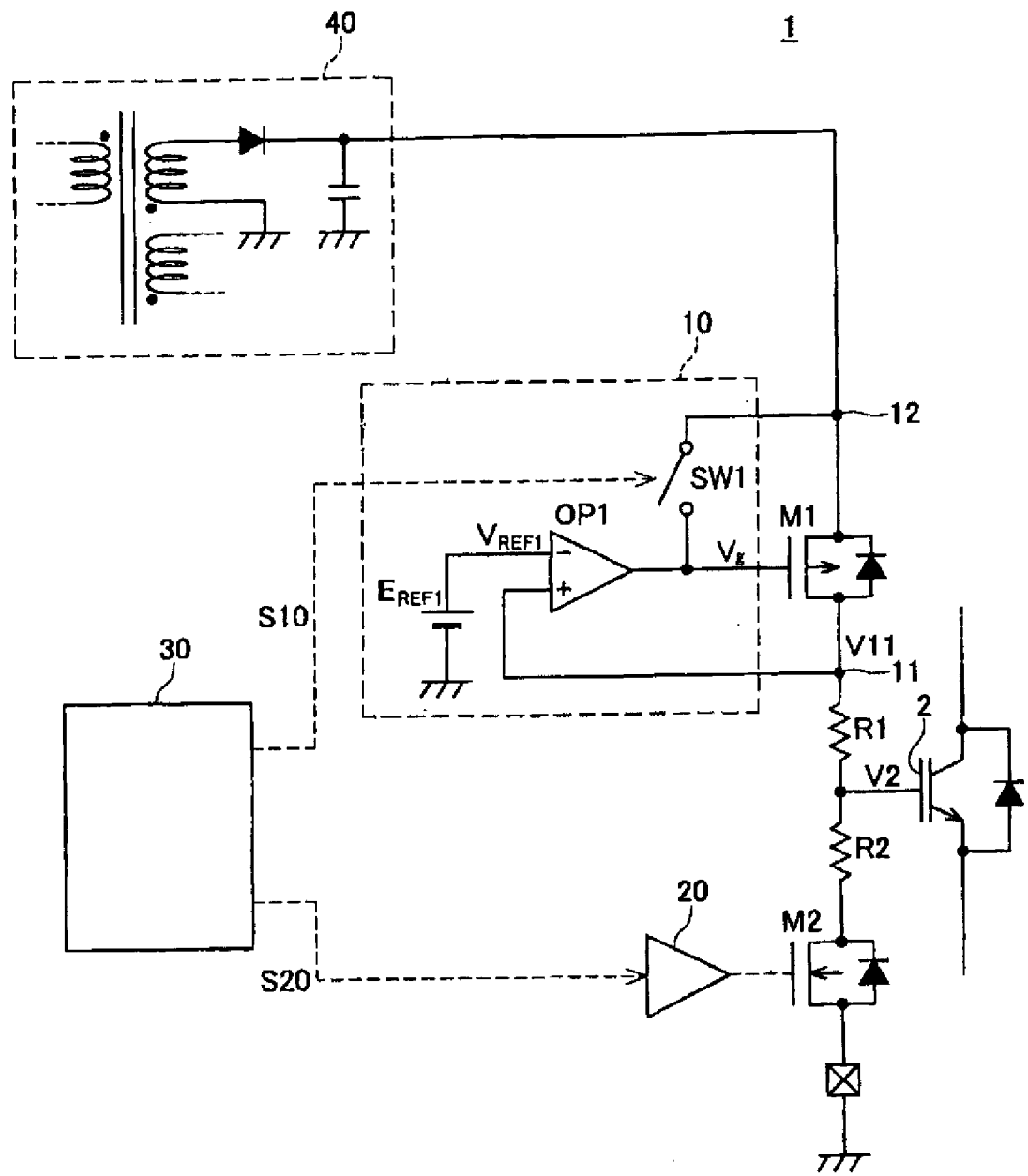
Figure 3:
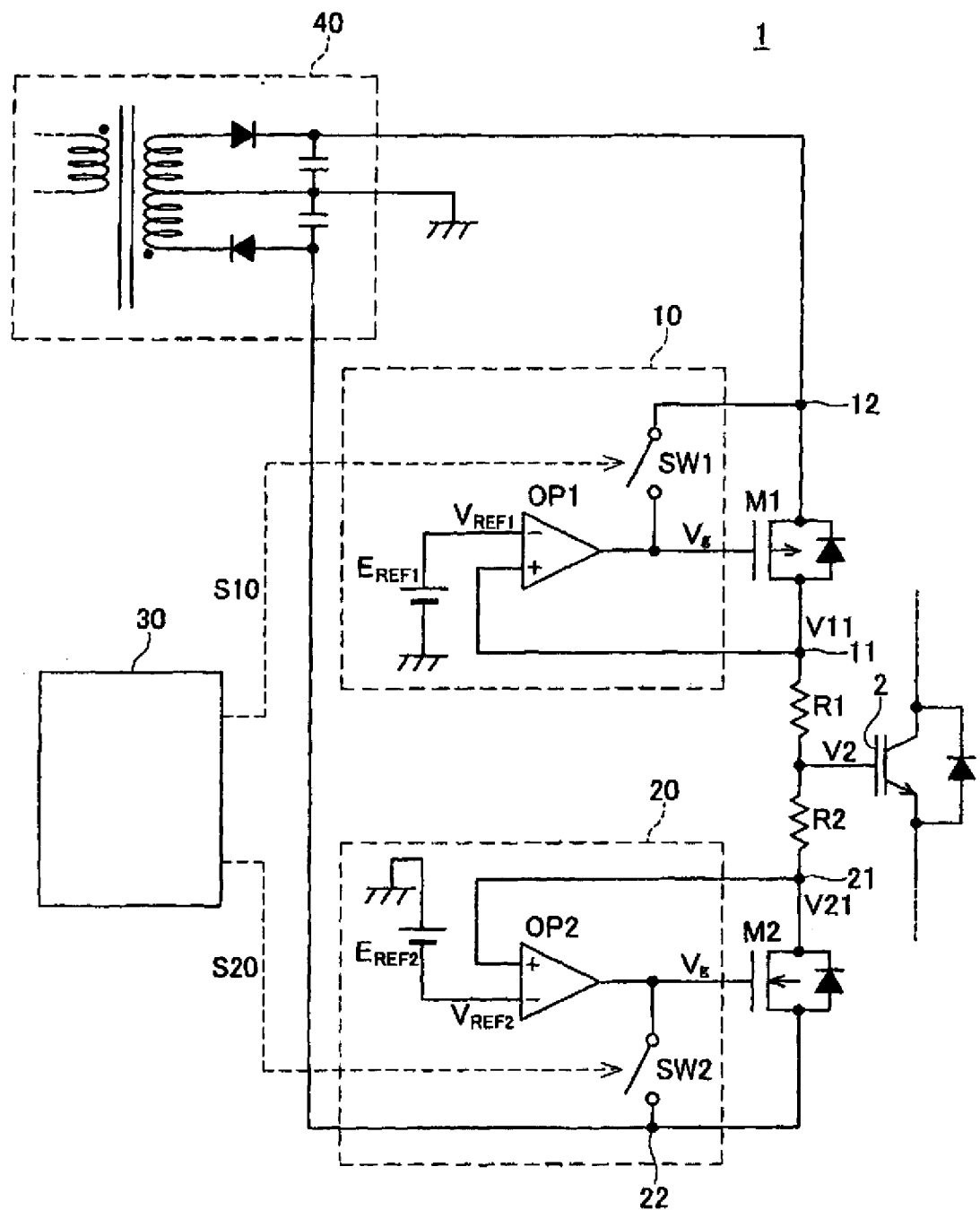
Figure 4:
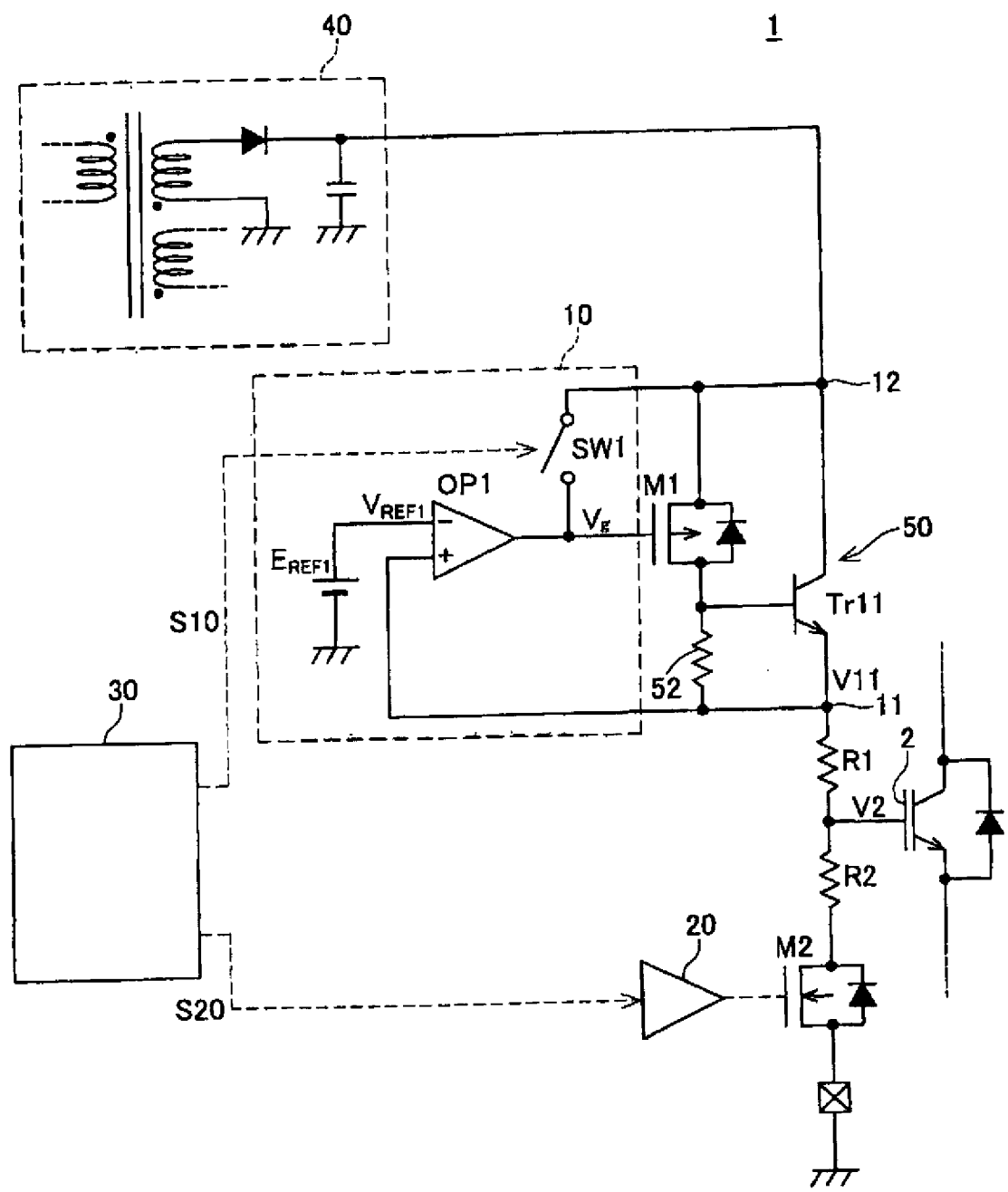
Figure 5:
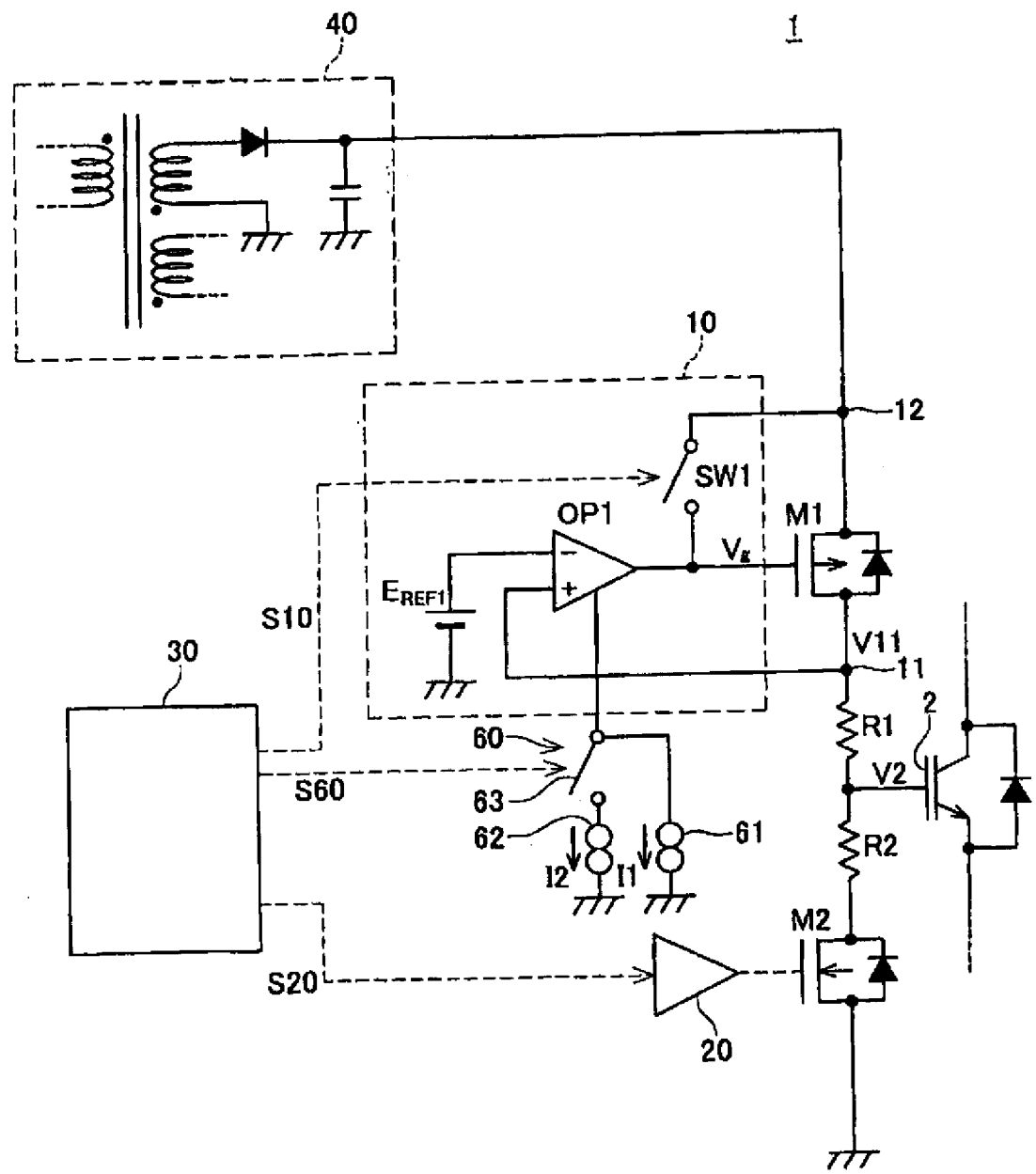
Figure 7:
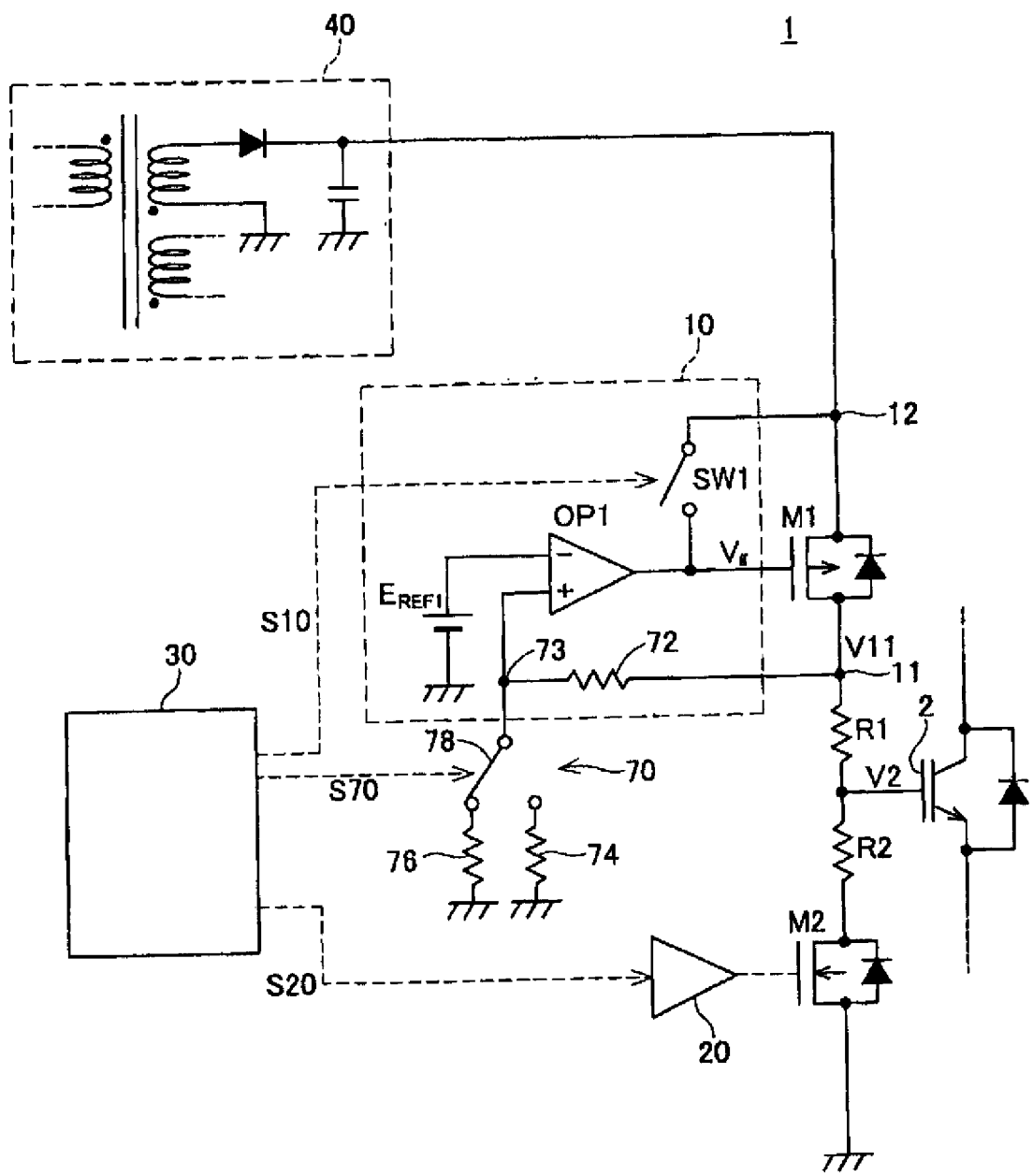

FIG. 8 shows a timing chart of the drive unit 1 of the fifth embodiment. FIG. 8 (A) shows the first driving signal S10 input to the first controller 10, FIG. 8(B) shows a partial voltage adjustment signal S70 input to the partial voltage adjusting circuit 70, FIG. 8(C) shows the voltage V11 of the first connector 11 and a gate voltage V2 of the insulated gate of the voltage-driven element 2.

As shown in FIG. 8(A), the first driving signal S10 of the first controller 10 rises at the time t1 and falls at a time t3. As described above, the first transistor M1 turns on in synchrony with the rise of the first driving signal S10, and turns off in synchrony with the fall of the first driving signal S10. Consequently, as shown in FIG. 8(C), the voltage V11 of the first connector 11 and the gate voltage V2 of the voltage-driven element 2 both increase at the time t1 and decrease at the time t3.

As shown in FIG. 8(B), the partial voltage adjustment signal S70 rises at the time t2, and falls at the time t3. The time t2 is set in a range after the Miller zone of the gate voltage V2 of the voltage-driven element 2 has ended. Thus, in the period when the voltage-driven element 2 is turned on, the partial voltage adjusting circuit 70 sets the voltage V11 of the first connector 11 to be low in a former half of the period, and sets the voltage V11 of the first connector 11 to be high in the latter half of the period.

Surge voltage is a particular problem in the former half of the period when the voltage-driven element 2 is turned on. By setting the voltage V11 to be low in the former half of the period when the voltage-driven element 2 is turned on, the partial voltage adjusting circuit 70 suppresses the surge voltage. By contrast, the surge voltage is not a particular problem in the latter half of the period when the voltage-driven element 2 is turned on. Consequently, by setting the voltage V11 to be high in the latter half of the period when the voltage-driven element 2 is turned on, the partial voltage adjusting circuit 70 suppresses an increase in switching loss, and reduces the on voltage of the voltage-driven element 2. Thus, by switching the switching speed of the voltage-driven element 2 over time, the partial voltage adjusting circuit 70 can improve the trade-off between the surge voltage and switching loss of the voltage-driven element 2.

Moreover, in the above example, the partial voltage adjusting circuit 70 sets the voltage V11 of the first connector 11 to be low in the former half of the period when the voltage-driven element 2 is turned on, and sets the voltage V11 of the first connector 11 to be high in the latter half. This is merely one example; the partial voltage adjusting circuit 70 may switch the voltage V11 of the first connector 11 with various sizes and times, as required.

Specific examples of the present techings are described above in detail, but these examples are merely illustrative and place no limitation on the scope of the patent claims. The technology described in the patent claims also encompasses various changes and modifications to the specific examples described above.

The technical elements explained in the present specification or drawings provide technical utility either independently or through various combinations. The present techings is not limited to the combinations described at the time the claims are filed. Further, the purpose of the examples illustrated by the present specification or drawings is to satisfy multiple objectives simultaneously, and satisfying any one of those objectives gives technical utility to the present techings.

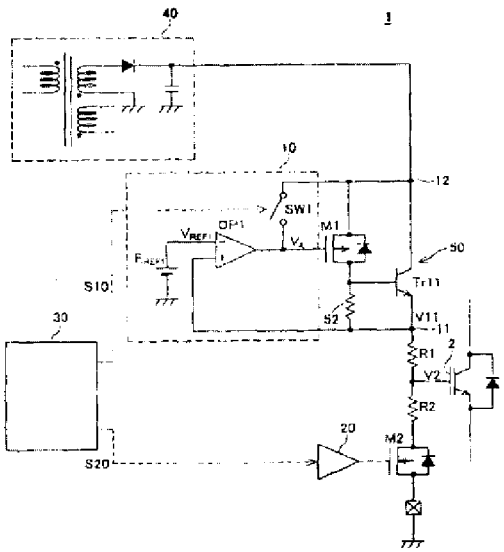

The invention claimed is:

1. A drive unit for driving a switching voltage-driven element, comprising:
    a first connector configured so as to be connected with a gate resistor of the switching voltage-driven element;
    a second connector configured so as to be connected with a driving power source;
    a switching element having a first input-output terminal connected to the first connector and a second input-output terminal connected to the second connector;
    a controller connected to a control terminal of the switching element, and controlling a voltage input to the control terminal of the switching element, wherein
    the controller has an error amplifier, a reference power source, and a switch,
    one input terminal of the error amplifier is connected to the reference power source, an other input terminal thereof is connected to the first connector, and an output terminal thereof is connected to the control terminal of the switching element,
    the switch has a first end, a second end, and a control terminal, and
    the first end of the switch is connected to the second connector, and the second end thereof is connected to the control terminal of the switching element.

2. The drive unit according to claim 1, wherein
the switch is configured so as to open in synchrony with turning on of the switching voltage-driven element.

3. The drive unit according to claim 1, further comprising:
    a current amplifier circuit amplifying an output current output from the first input-output terminal of the switching element and supplying an amplified output current to the first connector.

4. The drive unit according to claim 1, wherein the error amplifier is an operational amplifier, and further comprises:
    a tail current adjusting circuit configured to adjust a tail current value of the operational amplifier.

5. The drive unit according to claim 4, wherein when the switching voltage-driven element is turned on, the tail current adjusting circuit:
    (1) increases the tail current value before the voltage of the first connector reaches a steady state, and
    (2) reduces the tail current value before the voltage of the first connector reduces from the steady state.

6. The drive unit according to claim 1, wherein
the controller is configured to be capable of controlling the voltage that is input to the control terminal of the switching element in order to switch the voltage of the first connector to a fixed voltage having a different size.

7. The drive unit according to claim 1, wherein
the switching voltage-driven element is a semiconductor switching voltage driven element.

8. The drive unit according to claim 7, wherein the switching voltage-driven element is an IGBT or a MOSFET.

* * * * *

UNITED STATES PATENT AND TRADEMARK OFFICE
CERTIFICATE OF CORRECTION

PATENT NO. : 8,410,825 B2
APPLICATION NO. : 12/976481
DATED : April 2, 2013
INVENTOR(S) : Masaki Wasekura It is certified that error appears in the above-identified patent and that said Letters Patent is hereby corrected as shown below:

On the Title Page, delete drawing sheet and replace with attached title page.

In the Drawings

Please amend Figs. 2-5 and 7 based on the attached replacement drawing sheets, which makes changes to Figs. 2-5 and replaces the original sheets with sheets 1-5.

In the Specifications

Column 6, lines 50-59, please replace paragraph with the following rewritten paragraph:

The first controller 10 has an operational amplifier OP1, a reference power source $E_{REF1}$, and a switch SW1. An inverting input terminal of the operational amplifier OP1 is connected to the reference power source $E_{REF1}$, a non-inverting input terminal of the operational amplifier OP1 is connected to the first connector 11, and an output terminal of the operational amplifier OP1 is connected to a control terminal of the first transistor M1. One end of the switch SW1 is connected to the second connector 12, and the other end of the switch SW1 is connected to the control terminal of the first transistor M1.

Column 6, line 60 through Column 7, line 16, please replace paragraph with the following rewritten paragraph:

Next, the operation of the drive unit 1 will be described. In the first controller 10, when the switch SW1 is turned on based on the first driving signal S10 output from the control block 30, the first transistor M1 turns on. At this time, in the second controller 20, the second transistor M2 turns off based on the second driving signal S20 output from the control block 30. When the first transistor M1 turns on, a positive driving voltage is supplied to the first connector 11 from the driving power source Signed and Sealed this
Twenty-fifth Day of March, 2014

Michelle K. Lee
*Deputy Director of the United States Patent and Trademark Office*

40 via the first transistor M1. A voltage V11 of the first connector 11 is input to the non-inverting input terminal of the operational amplifier OP1, and the reference voltage $V_{REF1}$ of the reference power source $E_{REF1}$ is input to the inverting input terminal. Consequently, the first controller 10 compares the voltage V11 of the first connector 11 with the reference voltage $V_{REF1}$ and, based on the results of this comparison, controls a gate voltage Vg input to the first transistor M1. Consequently, the voltage V11 of the first connector 11 is maintained such that it conforms to the reference voltage $V_{REF1}$ of the reference power source $E_{REF1}$. Since the voltage V11 of the first connector 11 is being controlled with high precision, the charging speed of a gate current determined by the first gate resistor R1 connected directly with the first connector 11 is also controlled with high precision.

Column 7, line 50 through Column 8, line 2, please replace paragraph with the following rewritten paragraph:

Fig. 3 shows a basic configuration of a drive unit 1 of a second embodiment. This drive unit 1 is characteristically being provided with a circuit that controls voltage, with high precision, to a second controller 20 as well. In this case, a drain terminal of a second transistor M2 is connected to a second gate resistor R2 via a third connector 21, and a source terminal of the second transistor M2 is connected to a negative potential side wiring of a driving power source 40 via a fourth connector 22. The second controller 20 has a second operational amplifier OP2, a second reference power source $E_{REF2}$, and a second switch SW2. An inverting input terminal of the second operational amplifier OP2 is connected to the second reference power source $E_{REF2}$, a non-inverting input terminal of the second operational amplifier OP2 is connected to the third connector 21, and an output terminal of the second operational amplifier OP2 is connected to a control terminal of the second transistor M2. One end of the second switch SW2 is connected to the fourth connector 22, and the other end of the second switch SW2 is connected to the control terminal of the second transistor M2.

Column 8, lines 3-25, please replace paragraph with the following rewritten paragraph:

In the second controller 20, when the switch SW2 turns on based on a second driving signal S20 output from a control block 30, the second transistor M2 turns on. At this time, in the first controller 10, the first transistor M1 turns off based on a first driving signal S10 output from the control block 30. When the second transistor M2 turns on, a negative driving voltage is supplied to the third connector 21 from the driving power source 40 via the second transistor M2. A voltage V21 of the third connector 21 is input to the non-inverting input terminal of the second operational amplifier OP2, and the reference voltage $V_{REF2}$ of the second reference power source $E_{REF2}$ is input to the inverting input terminal. Consequently, the second controller 20 compares the voltage V21 of the third connector 21 with the reference voltage $V_{REF2}$ and, based on the results of comparison, controls a gate voltage Vg input to the second transistor M2. Consequently, the voltage V21 of the third connector 21 is maintained such that it conforms to the reference voltage $V_{REF2}$ of the second reference power source $E_{REF2}$. Since the voltage V21 of the third connector 21 is being controlled with high precision, the discharging speed of a gate current determined by the second gate resistor R2 connected directly with the third connector 21 is also controlled with high precision.

Column 10, line 56 through column 11, line 10, please replace paragraph with the following rewritten paragraph:

Fig. 7 shows a basic configuration of a drive unit 1 of a fifth embodiment. This drive unit 1 is characterized in comprising a partial voltage adjusting circuit 70 for switching a voltage V11 of a first connector 11. The partial voltage adjusting circuit 70 comprises first~third resistors 72, 74, 76 for adjusting a partial voltage, and a switch 78. The first resistor 72 for adjusting the partial voltage is a fixed resistive element. One end of the first resistor 72 is connected to the first connector 11, and the other end of the first resistor 72 is connected to an intermediate connection point 73. The second resistor 74 for adjusting partial voltage is a fixed resistive element. One end of the second resistor 74 is configured such that this end can be connected to the intermediate connection point 73 via the switch 78, and the other end of the second resistor 74 is grounded. The third resistor 76 for adjusting partial voltage is a fixed resistive element. One end of the third resistor 76 is configured such that this end can be connected to the intermediate connection point 73 via the switch 78, and the other end of the third resistor 76 is grounded. The intermediate connection point 73 is connected to the non-inverting input terminal of the operational amplifier OP1.

(12) United States Patent
Wasekura

(10) Patent No.: US 8,410,825 B2
(45) Date of Patent: Apr. 2, 2013

(54) DRIVE UNIT FOR DRIVING VOLTAGE-DRIVEN ELEMENT

(75) Inventor: Masaki Wasekura, Toki (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 12/976,481

(22) Filed: Dec. 22, 2010

(65) Prior Publication Data
US 2012/0025897 A1 Feb. 2, 2012

Related U.S. Application Data

(63) Continuation of application No. PCT/JP2010/062911, filed on Jul. 30, 2010.

(51) Int. Cl.
*H03K 3/00* (2006.01)
(52) U.S. Cl. .................................................. 327/108
(58) Field of Classification Search ................. None
See application file for complete search history.

(56) References Cited

U.S. PATENT DOCUMENTS

| 5,742,193 | A  | * | 4/1998  | Colli et al. | 327/170 |
| 5,910,924 | A  |   | 6/1999  | Tanaka et al. | |
| 6,072,289 | A  | * | 6/2000  | Li | 318/400.19 |
| 6,271,709 | B1 | * | 8/2001  | Kimura et al. | 327/380 |
| 6,329,872 | B1 | * | 12/2001 | Foroudi | 327/541 |
| 6,333,665 | B1 | * | 12/2001 | Ichikawa | 327/434 |
| 6,411,138 | B2 | * | 6/2002  | Yamakita et al. | 327/109 |
| 6,700,419 | B1 | * | 3/2004  | Fan et al. | 327/108 |
| 7,518,406 | B2 | * | 4/2009  | Isobe | 326/83 |
| 2009/0146714 | A1 | * | 6/2009 | Nakamori et al. | 327/170 |

FOREIGN PATENT DOCUMENTS

| JP | A-2000-228868 | 8/2000 |
| JP | A-2000-253646 | 9/2000 |
| JP | A-2001-352748 | 12/2001 |
| JP | A-2004-112916 | 4/2004 |
| JP | A-2006-222593 | 8/2006 |
| JP | A-2006-324963 | 11/2006 |
| JP | A-2009-141690 | 6/2009 |

OTHER PUBLICATIONS

International Search Report for International Patent Application No. PCT/JP2010/062911, mailed on Sep. 7, 2010 (w/ English translation).
Written Opinion for International Patent Application No. PCT/JP2010/062911, mailed on Sep. 7, 2010 (w/ partial English translation).

* cited by examiner

*Primary Examiner* — Lincoln Donovan
*Assistant Examiner* — Khareem E Almo
(74) *Attorney, Agent, or Firm* — Oliff & Berridge, PLC

(57) ABSTRACT

A drive unit comprises a first connector, second connector, switching element, and controller. The first connector is configured to be connected with a gate resistor of a voltage-driven element. The second connector is configured to be connected with a driving power source. A first input-output terminal of the switching element is connected to the first connector, and a second input-output terminal thereof is connected to the second connector. The controller is connected to a control terminal of the switching element, and controls a voltage input to the control terminal of the switching element. The controller has an error amplifier, reference power source, and switch. One input terminal of the error amplifier is connected to the reference power source, an other input terminal thereof is connected to the first connector, and an output terminal thereof is connected to the control terminal of the switching element. One end of the switch is connected to the second connector, and an other end thereof is connected to the control terminal of the switching element.

8 Claims, 8 Drawing Sheets